US008592804B2

(12) United States Patent
Rand et al.

(10) Patent No.: US 8,592,804 B2
(45) Date of Patent: Nov. 26, 2013

(54) METHOD FOR FABRICATING ORGANIC OPTOELECTRONIC DEVICES

(75) Inventors: Barry Rand, Leuven (BE); David Cheyns, Mechelen (BE); Benjamin Kam, Brasschaat (BE)

(73) Assignee: IMEC, Leuven (BE)

( * ) Notice: Subject to any disclaimer, the term of this patent is extended or adjusted under 35 U.S.C. 154(b) by 212 days.

(21) Appl. No.: 12/789,202

(22) Filed: May 27, 2010

(65) Prior Publication Data
US 2010/0301320 A1 Dec. 2, 2010

Related U.S. Application Data

(60) Provisional application No. 61/181,964, filed on May 28, 2009.

(51) Int. Cl.
H01L 51/46 (2006.01)

(52) U.S. Cl.
USPC ...... 257/40; 136/263; 257/431; 257/E31.003; 438/82

(58) Field of Classification Search
USPC ........ 257/40, 431, E31.003; 136/263; 438/82
See application file for complete search history.

(56) References Cited

U.S. PATENT DOCUMENTS

| 2002/0158242 | A1* | 10/2002 | Son et al. | 257/40 |
| 2005/0217722 | A1* | 10/2005 | Komatsu et al. | 136/263 |
| 2005/0269564 | A1* | 12/2005 | Narayan | 257/40 |
| 2006/0008740 | A1 | 1/2006 | Kido et al. | |
| 2006/0108578 | A1 | 5/2006 | Liu | |
| 2006/0145145 | A1* | 7/2006 | Nishio | 257/40 |
| 2007/0221926 | A1* | 9/2007 | Lee et al. | 257/79 |
| 2007/0246094 | A1* | 10/2007 | Brabec et al. | 136/244 |
| 2007/0272296 | A1* | 11/2007 | Brabec et al. | 136/255 |
| 2008/0265751 | A1* | 10/2008 | Smith et al. | 313/504 |
| 2009/0165854 | A1* | 7/2009 | Yamazaki et al. | 136/258 |
| 2010/0244000 | A1* | 9/2010 | Tanaka et al. | 257/40 |
| 2010/0282309 | A1* | 11/2010 | Pschirer et al. | 136/255 |
| 2012/0216870 | A1* | 8/2012 | So et al. | 136/263 |

FOREIGN PATENT DOCUMENTS

| WO | WO 2007/040601 A1 | 4/2007 |
| WO | WO 2009/016092 A2 | 2/2009 |
| WO | WO 2009/022552 A1 | 2/2009 |
| WO | WO 2009/070534 A1 | 6/2009 |

OTHER PUBLICATIONS

Zhao, et al., Efficient tandem organic solar cells with an Al/MoO3 intermediate layer, Applied Physics Letters 93, 083305, Aug. 2008.
Cattin et al., "MoO3 surface passivation of the transparent anode in organic solar cells using ultrathin films", Journal of Applied Physics 105, 034507, 2009, pp. 034507-1-034507-7, Feb. 10, 2009.
Van Hest et al., "Titanium-doped indium oxide: A high-mobility transparent conductor", Applied Physics Letters 87, 032111, 2005, pp. 032111-2-032111-3, Jul. 15, 2005.
European Search Report for European Patent Application No. 10163918.5-1235 dated Mar. 20, 2012 by European Patent Office.

* cited by examiner

*Primary Examiner* — Allan R Wilson
(74) *Attorney, Agent, or Firm* — Knobbe, Martens, Olson & Bear LLP

(57) ABSTRACT

An organic optoelectronic device and a method for manufacturing the same are disclosed. In one aspect, the device has a stack of layers. The stack includes a buffer layer and a first organic semiconductor layer adjacent to the buffer layer at a first side of the buffer layer. The buffer layer includes at least one transition metal oxide doped with a metal.

18 Claims, 8 Drawing Sheets

9(a)

9(b)

METHOD FOR FABRICATING ORGANIC OPTOELECTRONIC DEVICES

CROSS REFERENCE TO RELATED APPLICATIONS

This application claims priority under 35 U.S.C. §119(e) to U.S. provisional patent application 61/181,964 filed on May 28, 2009, which application is hereby incorporated by reference in its entirety.

BACKGROUND OF THE INVENTION

1. Field of the Invention

The present application relates to the field of organic optoelectronics. More in particular, the present application relates to methods for fabricating organic optoelectronic devices comprising doped metal oxides and to organic optoelectronic devices comprising such doped metal oxides.

2. Field of the Invention

Transparent conductive layers can be used as electrodes in organic optoelectronic devices such as for example organic photovoltaic cells or organic light emitting diodes. When used as an electrode in optoelectronic applications these layers need to be transparent (typically >80% in the visible portion of the spectrum) and have a good electrical conductivity, e.g. with a sheet resistance below 100 Ohm per square. Transparent conducting oxides (TCOs) comprising metal oxides such as Indium Tin Oxide (ITO) or aluminum-doped zinc oxide currently dominate applications and products in this area. Alternative approaches have been developed based on organic conductors such as PEDOT or composite materials such as carbon nanotube/polymer films and metal nanowire meshes. However these approaches either do not reach the same level of conductivity as TCOs, or result in a large roughness leading to shunt paths through the devices. Furthermore, the work functions of such composite films are not easily controlled, which has an impact on charge injection and carrier collection.

Metal oxide layers with a low electrical conductivity, for example in the order of about $10^{-6}$ S/cm, are not useful as electrodes. However, such layers can be used as a buffer layer between an active organic layer and an electrically conductive contact of an organic optoelectronic device such as an organic photovoltaic cell or an organic light emitting device. These metal oxide layers act as a charge collecting layer and allow for tuning the work function of the contacts. Electron collecting metal oxides, such as for example ZnO or $TiO_x$, have a low work function (e.g. lower than 4.5 eV), and can be applied next to the cathode (i.e. the electron extracting or injecting contact). Hole collecting metal oxides, such as for example $WO_3$, $V_2O_5$, $MoO_3$ or NiO have a high work function (e.g. higher than 4.5 eV) and can be applied next to the anode (i.e. the hole extracting or injecting contact). As compared to organic materials such as BCP (bathocuproine) or PEDOT, these oxides have the advantage of being stable materials.

Many of these metal oxides have relatively low electrical conductivities, e.g. in the order of about $10^{-6}$ S/cm. Therefore, in view of forming devices with a sufficiently low electrical series resistance, the metal oxide layer thickness is limited to values of less than 20 nm to 25 nm. However, thicker metal oxide layers may be useful, for example in view of realizing a good barrier layer or buffer layer for preventing damage to an underlying organic semiconductor layer that may e.g. result from a metal contact formation process, or for realizing a good charge blocking layer, or in view of providing an optical spacer layer that can help to locate the position of the point of maximum optical field intensity at a preferred location in the absorbing organic layers (as e.g. described in WO 2007/040601).

Different methods can be used for forming such metal oxide layers.

For example, the low work function ZnO and $TiO_x$ as well as the high work function ITO can be provided by solution processing. A particular aspect related to solution processing is the need for compatibility of a solution processed layer with the underlying layer (e.g. an organic semiconductor layer), i.e. there is a need for avoiding dissolution of underlying layers by a solvent of the solution processed layer. These oxides can also be provided by electron beam evaporation, preferably in an oxygen environment in order to obtain good mobilities. However, an underlying organic layer can be damaged due to the oxygen environment.

Transparent metal oxides can also be formed by sputtering. When using a sputtering process for forming transparent metal oxides (such as e.g. ITO, AZO, ZnO, $TiO_2$, $MoO_3$, $WO_3$) directly on an organic layer, there is a challenge in controlling and avoiding damage to the top surface of the organic layer. Sputter deposition of metal oxides on an organic layer is known to cause damage to underlying organic layers, necessitating special processing conditions or sacrificial layers to avoid a decrease in device performance.

D. W. Zhao et al (applied physics letters 93, 083305 (2008)) discloses a tandem organic solar cell comprising an intermediate layer between two solar cells of complementary spectra. The intermediate layer consists of Al (1 nm) and $MoO_3$ (15 nm). This intermediate layer is reported to have a good transparency and to provide a good protection of the bottom cell polymer in solution-processed tandem cells. However, as mentioned above, good charge blocking layers or optical spacer layers require higher thickness of the intermediate layer.

DETAILED DESCRIPTION OF THE PREFERRED EMBODIMENT

One aspect relates to optoelectronic devices comprising an intermediate layer which can be simultaneously thick enough to permit good barrier and/or buffer properties, sufficiently transparent to make it suitable for use in a solar cell and sufficiently conducting to keep the series resistance of the device at a low level.

Certain aspects relate to a method for fabricating organic optoelectronic devices, wherein the method comprises providing at least one metal oxide layer that is optically transparent (e.g. > about 80% in the relevant portion of the spectrum) and has a good electrical conductivity (e.g. an electrical conductivity higher than about $10^{-5}$ S/cm, preferably higher than about $10^{-4}$ S/cm) and wherein the at least one metal oxide layer can be formed directly on an underlying organic layer, e.g. organic semiconductor layer, with no risk or with a very limited risk of damaging the organic layer, e.g. organic semiconductor layer.

Certain aspects relate to a metal oxide layer that is doped, e.g. with a metal, to increase the electrical conductivity as compared to a non-doped metal oxide layer, and wherein the doped metal oxide layer can be provided by a method with no or a very limited risk of damaging an underlying organic layer. For example, thermal evaporation may be used for forming the doped metal oxide layers. Doping of a metal oxide layer with a metal can for example be realized by thermal co-evaporation of the metal oxide and the metal. Other techniques may be used for forming the doped metal oxide layers, such as for example electron beam evaporation (in vacuum) or laser ablation. Different of these techniques may be combined.

It is an advantage of doped metal oxide layers according to one aspect that they can be used in organic optoelectronic devices such as organic photosensitive devices or organic light emitting devices and that they can be sufficiently thick without significantly increasing the series resistance of the devices and without significantly reducing the transparency of the metal oxide layers. For example, doped metal oxide layers according to one aspect can advantageously be used for controlling optical interference (i.e. wherein a doped metal oxide layer is used as an optical spacer, as e.g. described in WO2007/040601). Moreover, doped metal oxide layers according to one aspect can be made sufficiently thick for ensuring closed layers such that e.g. solvents or other elements used in a process for forming a layer such as e.g. a metal layer on top of the doped metal oxide layer cannot penetrate through the doped metal oxide layer, thereby avoiding damage to the underlying organic layer. Doped metal oxide layers according to one aspect can be made sufficiently thick for preventing damage resulting from sputtering of a layer, e.g. a contact layer, on top of organic devices.

Certain aspects relate to a method for fabricating an organic optoelectronic device, the method comprising providing a stack of layers, the stack comprising a buffer layer and a first organic semiconductor layer adjacent to the buffer layer at a first side of the buffer layer, wherein providing the buffer layer comprises providing at least one metal oxide layer doped with a metal. The buffer layer may be provided by thermal co-evaporation of a metal and a metal oxide. In alternative embodiments it may be provided by electron beam evaporation in vacuum or by laser ablation. Different techniques may be combined for providing the buffer layer.

The metal oxide may for example be a transition metal oxide. It may be a high work function metal oxide or a low work function metal oxide.

The method may further comprise forming an electrical contact layer at a second side of the buffer layer opposite to the first side.

The method may further comprise forming a second organic semiconductor layer at a second side of the buffer layer opposite to the first side.

Certain aspects relate to an organic optoelectronic device comprising a stack of layers, the stack comprising a buffer layer and a first organic semiconductor layer adjacent to the buffer layer at a first side of the buffer layer, wherein the buffer layer comprises at least one metal oxide doped with a metal.

The metal may for instance be a transition element, a lanthanide, an actinide or one of the following other metals: Al, Ga, In, Tl, Pb, Bi and Sn. Preferably, it is a transition metal (group Ib to VIIIb), a lanthanide or Al, more preferably it is a transition metal selected in the group IB (e.g. Au or Ag), Al or Yb.

The metal oxide may for example be a transition metal oxide. The transition metal oxide can for instance belong to the group Vb, VIb, VIIb or VIIIb of the periodic table of the elements. For instance, the transition metal oxide can be selected from $MoO_3$, $MoO_2$, $WO_3$, $V_2O_5$, $ReO_3$ and $NiO$ amongst others. Preferred transition metal oxides are $MoO_3$, $WO_3$, and $V_2O_5$. It may be a high work function metal oxide or a low work function metal oxide.

The electrical conductivity of the metal doped metal oxide is preferably larger than about $10^{-5}$ S/cm, more preferred larger than about $10^{-4}$ S/cm.

The thickness of the buffer layer may be in the range between about 2 nm and 500 nm, between about 20 nm and 300 nm or between about 30 nm and 150 nm. The thickness of the buffer layer may be selected for optimizing a light intensity profile in the device. The thickness of the buffer layer may be selected for providing a good protection of an underlying organic semiconductor layer, e.g. a good protection against influences of process steps (e.g. sputtering, solution processing) that may be used in fabricating the device.

The optical transparency of the buffer layer may be larger than about 80% in the relevant portion of a light spectrum, for example in a wavelength range between about 300 nm and 1200 nm.

The organic optoelectronic device may further comprise an electrical contact layer at a second side of the buffer layer opposite to the first side.

The organic optoelectronic device may further comprise a second organic semiconductor layer at a second side of the buffer layer opposite to the first side.

The organic optoelectronic device according to one preferred embodiment can for example be a photovoltaic cell or a photodetector or a light emitting device.

Certain aspects, both as to organization and method of operation, together with features and advantages thereof, may best be understood by reference to the following detailed description when read with the accompanying drawings.

DETAILED DESCRIPTION OF THE PREFERRED EMBODIMENT

Figure 1:
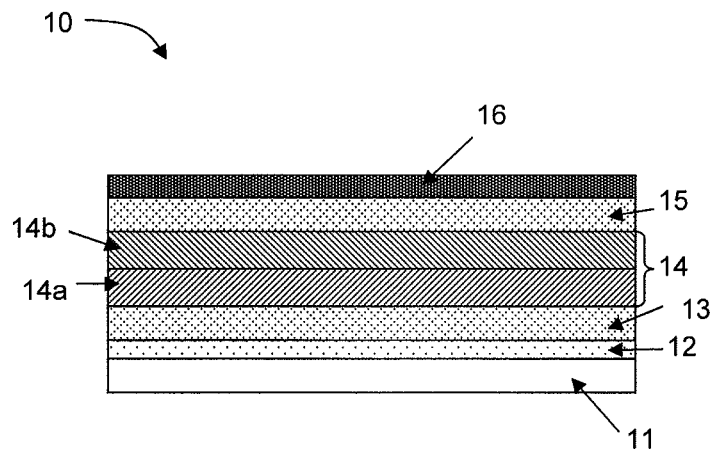
FIG. 1 illustrates the structure of a single junction organic photovoltaic cell comprising metal oxide buffer layers according to a preferred embodiment.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present description, the only relevant components of the device are A and B.

Reference throughout this specification to "one embodiment" or "an embodiment" means that a particular feature, structure or characteristic described in connection with the embodiment is included in at least one embodiment of the present description. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various aspects. However, aspects lie in less than all features of a single foregoing disclosed embodiment.

Furthermore, while some embodiments described herein include some but not other features included in other embodiments, combinations of features of different embodiments are meant to be within the scope of the invention, and form different embodiments, as would be understood by those in the art. For example, any of the embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention not being limited thereto.

Certain embodiments relate to a method for fabricating organic optoelectronic devices, wherein the method comprises providing at least one metal oxide layer that is optically transparent (e.g. >80% in the relevant portion of the spectrum) and has a good electrical conductivity (e.g. an electrical conductivity higher than about $10^{-5}$ S/cm, preferably higher than about $10^{-4}$ S/cm) and wherein the at least one metal oxide layer can be formed directly on an underlying organic layer, e.g. organic semiconductor layer, with no risk or a very limited risk of damaging the organic layer, e.g. organic semiconductor layer.

Certain embodiments relate to a metal oxide layer that is doped, e.g. with a metal, to increase the electrical conductivity as compared to a non-doped metal oxide layer, and wherein the doped metal oxide layer can be provided by a method with no or a very limited risk of damaging an underlying organic layer. For example, thermal evaporation may be used for forming the doped metal oxide layers. Doping of a metal oxide layer with a metal can for example be realized by thermal co-evaporation of the metal oxide and the metal. Other techniques may be used for forming the doped metal oxide layers, such as for example electron beam evaporation (in vacuum) or laser ablation. Different of these techniques may be combined. The metal and the metal oxide can be provided by the same technique or by different techniques. For example, a combination of an electron beam evaporated metal oxide doped with a thermally evaporated metal may be possible.

The doped metal oxide layer, e.g. acting as a buffer layer or as an optical spacer layer in an optoelectronic device, is preferably optically transparent (e.g. >80% transparency) in the wavelength range of interest (e.g. in the wavelength range between 300 nm and 1200 nm) and has preferably a good electrical conductivity (e.g. higher than about $10^{-5}$ S/cm) such that relatively thick layers (e.g. in the range between 2 nm and 500 nm, e.g. in the range between 20 nm and 300 nm, e.g. in the range between 30 nm and 150 nm) can be used in an organic optoelectronic device without substantially increasing the series resistance of the device. Doping a metal oxide layer, e.g. with a metal, leads to an increase in electrical conductivity but may lead to a reduced transparency. Therefore the doping level may be optimized for obtaining a good compromise between good electrical conductivity and good optical transparency. The doped metal oxide layers preferably have a low rms roughness, preferably lower than the thickness of a layer that is provided on top of the doped metal oxide layer.

It is an advantage of doped metal oxide layers according to one embodiment that they can be used in organic devices such as organic photosensitive devices or organic light emitting devices and that they can be sufficiently thick without significantly increasing the series resistance of the device and without significantly reducing the transparency of the metal oxide layer. For example, doped metal oxide layers can advantageously be used for controlling optical interference (wherein the doped metal oxide layer acts as an optical spacer layer, leading to a spatial redistribution of the light intensity inside the device). Moreover, doped metal oxide layers can be made sufficiently thick for ensuring closed layers such that e.g. solvents or other elements used in a process for forming a layer such as e.g. a metal layer on top of the doped metal oxide layer cannot penetrate through the doped metal oxide layer, thereby avoiding damage to an underlying layer, e.g. an underlying organic semiconductor layer. Doped metal oxide layers can be made sufficiently thick for preventing damage to an underlying layer, e.g. underlying organic semiconductor layer, from sputtering of a layer such as e.g. a contact layer or another layer on the doped metal oxide layer.

In the further description, exemplary embodiments are described wherein a metal doped metal oxide layer is used as a buffer layer or as an optical spacer layer in organic photovoltaic cells. However, the doped metal oxide layers can also advantageously be used in other organic optoelectronic devices, such as for example organic light emitting devices and organic light sensitive devices.

Figure 2:
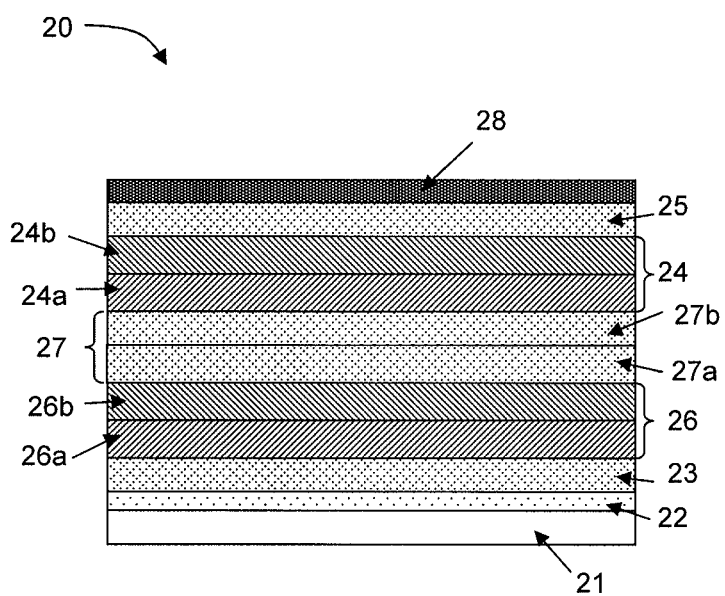
FIG. 2 illustrates the structure of an organic tandem or multijunction photovoltaic cell comprising metal oxide buffer layers according to a preferred embodiment.

FIG. 1 and FIG. 2 show examples of organic photovoltaic cells wherein doped metal oxides can advantageously be used. FIG. 1 shows the structure of a single junction organic photovoltaic cell 10. In the example shown, the photovoltaic cell is formed on a transparent substrate 11, e.g. a glass substrate. The photovoltaic cell structure shown consists of a stack of layers, the stack comprising a first electrically conductive and transparent contact layer 12, e.g. a TCO (transparent conducting oxide) layer, acting as a first electrode, an organic photovoltaic layer 14 and a second electrically conductive contact layer 16, e.g. a metal contact layer, acting as a second electrode. The organic photovoltaic layer 14 can for example have a planar heterojunction configuration, e.g. the organic photovoltaic layer 14 can comprise a first organic layer 14a, e.g. an electron donor layer, and a second organic layer 14b, e.g. an electron acceptor layer or vice versa. In alternative embodiments the organic photovoltaic layer 14 can for example have a bulk heterojunction configuration. The stack of layers further comprises, in between the first electrical contact layer 12 and the organic photovoltaic layer 14, a first metal oxide layer 13. Alternatively or in addition thereto, in between the second electrical contact layer 16 and the organic photovoltaic layer 14 a second metal oxide layer 15 can be provided. The single junction photovoltaic cell shown in FIG. 1 can be used as a standard or conventional cell (i.e. wherein the transparent contact layer 12 or first electrode acts as an anode or hole collecting electrode and wherein the second electrode 16 acts as a cathode or electron collecting electrode) or as an inverted cell (i.e. where the transparent contact layer 12 or first electrode acts as a cathode or electron collecting electrode and wherein the second electrode 16 acts as an anode or hole collecting electrode).

In preferred embodiments the first metal oxide layer 13 and/or the second metal oxide layer 15 can be a doped metal oxide layer. These layers act as a charge collecting layer and may have the function of a barrier layer. For example, the second metal oxide layer 15 can be used as a barrier layer preventing damage to the organic photovoltaic layer 14 that may be caused by the formation of the second electrode 16, e.g. when the second electrode 16 is formed by sputter deposition or by solution processing. It is preferred that the second metal oxide layer 15 acting as a buffer layer can be made sufficiently thick to form a good barrier layer without significantly increasing the series resistance of the photovoltaic cell. Therefore, in preferred embodiments, the metal oxide layer is doped to decrease its electrical resistance. The doped metal oxide layers can also have an optical function. For example, the second doped metal oxide layer 15 at the rear side of the photovoltaic cell shown in FIG. 1 can act as an optical spacer layer. Also in this case there is a need for providing an optimal thickness of the metal oxide layer 15 without significant increase in series resistance. In a standard or conventional photovoltaic cell the second metal oxide layer comprises a low work function metal oxide. In an inverted photovoltaic cell the second metal oxide layer comprises a high work function metal oxide.

FIG. 2 shows the structure of a tandem or multijunction (in the example shown two-junction) organic photovoltaic cell 20. Such an organic photovoltaic cell comprises multiple (in the example shown two) single junction cells that are stacked on top of each other and that are preferably sensitive to a different part of the incident light spectrum. In the example shown in FIG. 2, the tandem cell is formed on a transparent substrate 21 covered with a first transparent contact layer 22. The tandem photovoltaic cell 20 comprises a top cell with top organic photovoltaic layer 26 that can comprise more than one layer, e.g. a first photovoltaic layer 26a and a second photovoltaic layer 26b, and a bottom cell with bottom organic photovoltaic layer 24 that can comprise more than one layer, e.g. a first photovoltaic layer 24a and a second photovoltaic layer 24b. Metal oxide layers can be provided in between the first electrode 22 and the top organic photovoltaic layer 26 (first metal oxide layer 23) and/or between the second electrode 28 and the bottom organic photovoltaic layer 24 (second metal oxide layer 25) and/or between both organic photovoltaic layers 24 and 26 (third metal oxide layer 27). The third metal oxide layer 27 can be a stack of layers, for example comprising a first metal oxide layer 27a and a second metal oxide layer 27b, possibly with a recombination center (e.g. a metal layer) in between. Optimizing the thickness of the metal oxide layers 27a, 27b can advantageously be used for optimizing the light intensity profile in the device such that both the top cell and the bottom cell can absorb an optimized amount of light.

In the exemplary embodiments shown in FIG. 1 and FIG. 2 a glass substrate is used. However, other suitable transparent substrates known by a person skilled in the art may be used as a substrate, for example a polymeric foil such as e.g. a PET or PEN foil or a plastic sheet. In preferred embodiments also a non-transparent substrate such as a steel foil or a cupper foil can be used, provided that the second electrode is transparent.

The first electrode 12, 22 and/or the second electrode 16, 28 may comprise an optically transparent conductor such as for example TiOx, ITO (Indium Tin Oxide), ZnO, AZO (Aluminum doped ZnO), FTO (Fluorine doped Tin Oxide) or thin metallic layers such as for example layers comprising e.g. Au, Ag, or Cu or metallic compound layers such as Mg:Ag. The first electrode 12, 22 and the second electrode 16, 28 can also comprise conductive polymers such as e.g. PEDOT (Poly(3,4-ethylenedioxythiophene)) or PANI (Polyaniline). These conductive polymers can be doped to increase the conductivity, for example they can be doped with anions, metallic nanoparticles, nanotubes or any other suitable material known by a person skilled in the art. Furthermore, an electrically conductive grid, e.g. a metallic grid (e.g. comprising Cu or Ag) can be provided adjacent to the first electrode 12, 22 and/or the second electrode 16, 28 to further enhance the conductivity without creating high losses in optical transparency. The material of the first electrode 12, 22 and the second electrode 16, 28 can be provided, e.g. deposited, by means of several techniques, such as for example thermal evaporation in vacuum, sputtering, chemical vapor deposition or solution processing wherein the materials to be deposited are dissolved in appropriate solvents in appropriate quantities to be handled in processes such as e.g. spincoating, doctor blading, inkjet printing, screen printing, gravure printing, flexo printing, slot die coating, spray coating or alike.

In the examples shown in FIG. 1 and FIG. 2, the first electrode 12, 22 is located at the front side of the photovoltaic cell, i.e. at the side of the photovoltaic cell adapted for being oriented towards a light source and thus for receiving illumination. The second electrode 16, 28 is located at the back side of the photovoltaic cell, i.e. at side opposite to the front side. In such a configuration, the second electrode 16, 28 may be optically non-transparent, for example the second electrode may be a metal electrode comprising for example Ba, Ca, Mg, Al, Ag or Cu or metal alloys comprising two or more metals. For example, if the second metal oxide layer 15 (FIG. 1) acts as an optical spacer layer, the second electrode 16 is preferably non-transparent and light reflecting. In other embodiments the second electrode 16, 28 may be located at the front side of the photovoltaic cell and the substrate 11, 21 with the first electrode 12, 22 may be located at the rear side of the cell. In such embodiments a non-transparent substrate 11, 21 and a transparent second electrode 16, 28 may be used; the first electrode 12, 22 may be transparent or non-transparent.

The active layer or photovoltaic layer 14, 24, 26 comprises at least one light-absorbing layer, wherein light absorption results in the generation of electrical charges. The active layer can comprise more than one light-absorbing, charge generating layer when these light-absorbing, charge generating layers are separated from each other by a charge recombination layer. The active layer comprises materials that are suitable for absorption of the incoming light and for charge carrier generation and transport of charge carriers to the adjacent electrodes. It can comprise a single layer or two adjacent layers of different organic conjugated materials. If two layers of different materials are used, there can be intentional or unintentional mixing of these two materials in the proximity of the interface between the two materials. The active layer 14, 24, 26 can also comprise a mixture of two or more different organic conjugated materials in a single layer. The active layer can also comprise a mixture of an organic conjugated material with metallic or semi-conducting non-conjugated materials. Organic conjugated materials can comprise materials such as for example polymers, e.g. polyphenylene, polyphenylenvinylene, polythiophene, polyfluorene and their derivatives, or for example low molecular weight molecules, e.g. pentacene, perylene, anthracene, naphthalene, phthalocyanine and their derivatives, or for example fullerenes, e.g. C60, C70 and their derivatives, or for example nanotubes, e.g. SWCNT (single walled carbon nanotubes), MWCNT (multi walled carbon nanotubes) and their derivatives.

The materials of the active layer 14, 24, 26 can be deposited by means of several techniques, such as for example thermal evaporation in vacuum, wherein eventually an additional inert carrier gas such as e.g. nitrogen or argon can be introduced to guide the material efficiently onto the electrode. An alternative method for providing the materials of the active layer is OVPD (organic vapor phase deposition). The materials of the active layer can for example also be deposited by means of solution processing, wherein the materials to be deposited are dissolved in appropriate solvents in appropriate quantities to be handled in processes such as e.g. spincoating, doctor blading, inkjet printing, screen printing, gravure printing, flexo printing, slot die coating, or spray coating.

For a standard organic photovoltaic cell structure, wherein a cathode or electron extracting contact is formed after providing the organic semiconductor layer, there is a need for a stable electron collecting barrier layer or buffer layer on top of the organic semiconductor layer. Such an electron collecting barrier layer can for example be formed by a layer comprising a (low work function) conductive oxide such as ZnO, TiOx. Formation of such oxides can be done by sputtering or by solution processing or by electron beam evaporation in an oxygen environment. These methods may lead to damage to the underlying organic semiconductor layer and thus result in low photovoltaic cell efficiencies.

Therefore, it may be preferred to use an inverted organic photovoltaic cell structure, wherein a cathode or electron extracting contact is formed before providing the organic semiconductor layer, and wherein an anode or hole extracting contact is formed after providing the organic semiconductor layer. When forming the top metal contact (i.e. anode) of such an inverted structure there is a need for a stable hole collecting barrier layer between the organic semiconductor layer and the hole extracting metal contact (i.e. anode).

The fabrication of organic photovoltaic cells with inverted geometries has received considerable attention in recent years. One approach to form an inverted photovoltaic cell structure is to use a solution processed low work function metal oxide such as ZnO or TiOx as a first buffer layer or barrier layer on the ITO surface and for example using a spin cast PEDOT layer as a second buffer layer or barrier layer on top of the organic photovoltaic layer. The problems with this device are twofold. First, the ZnO and TiOx are not highly conductive and therefore the device performance (fill factor and extracted photocurrent) is strongly dependent on the thickness of these oxide layers. Second, it is difficult to apply the water-based PEDOT layer to the hydrophobic organic photovoltaic layer, and it is not known to what extent the water solution damages the water sensitive organic materials underneath.

One embodiment provides an alternative approach, wherein buffer layers or barrier layers with a good electrical conductivity are provided, leading to a device performance that is less dependent on the thickness of these buffer layers, and wherein the buffer layers are stable layers that can be provided directly on the organic photovoltaic layer without a risk or with a very limited risk of damaging that layer. For example, instead of using a PEDOT layer as second buffer layer in the inverted photovoltaic cell structure described above, a metal doped metal oxide can be used in preferred embodiments.

One embodiment provides metal doped metal oxide layers with a good electrical conductivity and a good transparency that can be formed by co-deposition of a transition metal oxide and a metal, for example co-deposition of a metal oxide such as for example $MoO_3$, $MoO_2$, $WO_3$, $V_2O_5$, $ReO_3$, NiO, and a metal such as for example Al, Ag, Au or Yb. Methods that can be used for forming the doped metal oxides are for example thermal evaporation, electron beam evaporation or laser ablation. For example, a metal doped metal oxide can be formed by thermal co-evaporation of the metal and the metal oxide. It is an advantage that the metal doped oxides can be formed directly on top of an organic layer, e.g. organic semiconductor layer, without damaging the organic layer.

Experiments were performed to show that doping of metal oxide layers with a metal can indeed lead to an increased electrical conductivity of these layers without significant penalty in transparency and that consequently thicker layers can be used as compared to undoped metal oxide layers. The possibility to use thicker metal oxide layers leads to a larger freedom in device design.

Experiments were performed wherein a MoO3 layer was incorporated between the ITO layer 12 and the organic photovoltaic layer 14 of an organic photovoltaic cell 10 as illustrated in FIG. 1. The different layers of the organic photovoltaic cells were provided by means of vacuum thermal evaporation. The thermal evaporation was performed at a pressure between $10^{-5}$ and $10^{-4}$ Pa. Substrates were fixed in a holder that rotates during the evaporation process with a speed of 5 rotations per minute. The thickness of the layers and the evaporation speed were measured in situ by means of Quartz Crystal Microbalance (QCM). Co-evaporation of two materials e.g. of a metal oxide and a metal was done by evaporating both materials simultaneously and by controlling the evaporation speed for both materials separately. In the experiments, glass substrates (size 3 cm×3 cm) were used with patterned ITO lines that were used as an anode in organic photovoltaic cell structures. An overview of the materials used in the photovoltaic cell structure and their parameters is shown in Table 1.

TABLE 1

| Material | HOMO/LUMO or Work Function [eV] | Function | Evaporation speed [nm/s] |
|---|---|---|---|
| $MoO_3$ | 5.3/2.3 | buffer layer | 0.1 or 0.2 |
| CuPc | 5.2/3.2 | donor | 0.1 |
| $C_{60}$ | 6.2/3.6 | acceptor | 0.1 |
| BCP | | Electron Blocking Layer | 0.1 |
| Al | 4.3 | top contact doping | 0.1-0.2 0.002 |
| Ag | 4.4 | top contact doping | 0.07-0.1 0.001 or 0.002 |
| Au | 5.1 | doping | 0.002 |

The experiments were performed for photovoltaic cells with a planar heterojunction structure (as illustrated in FIG. 1). The size of the cells was 0.134 $cm^2$. The dark current-voltage characteristics were measured with an Agilent 4156C parameter analyzer. The current-voltage characteristics under illumination were measured with an AM1.5D solar simulator (100 $mW/cm^2$).

Cells were fabricated with a 20 nm to 100 nm thick $MoO_3$ layer on top of the ITO layer, followed by an organic photovoltaic layer comprising 30 nm of CuPc (Cupper Phthalocyanine) and 50 nm of $C_{60}$, with a 8 nm thick BCP (Bathocuproine) barrier layer and a 100 nm Al metal contact layer on top.

Figure 3:
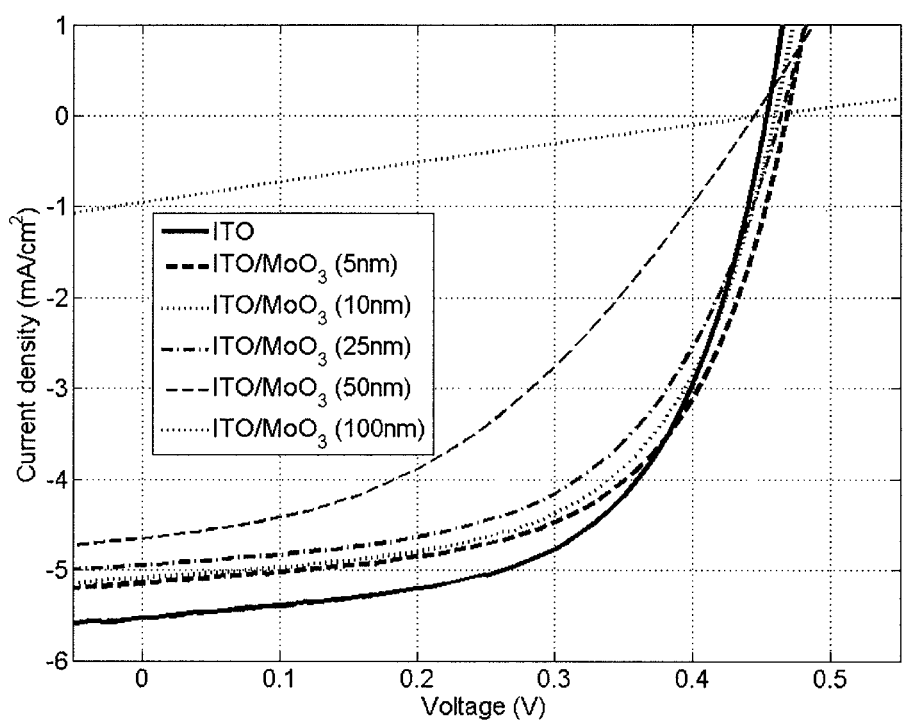
FIG. 3 shows the measured current-voltage characteristics under illumination for organic photovoltaic cells according to preferred embodiments with an undoped metal oxide buffer layer between the organic photovoltaic layer and an ITO contact layer.
Figure 4:
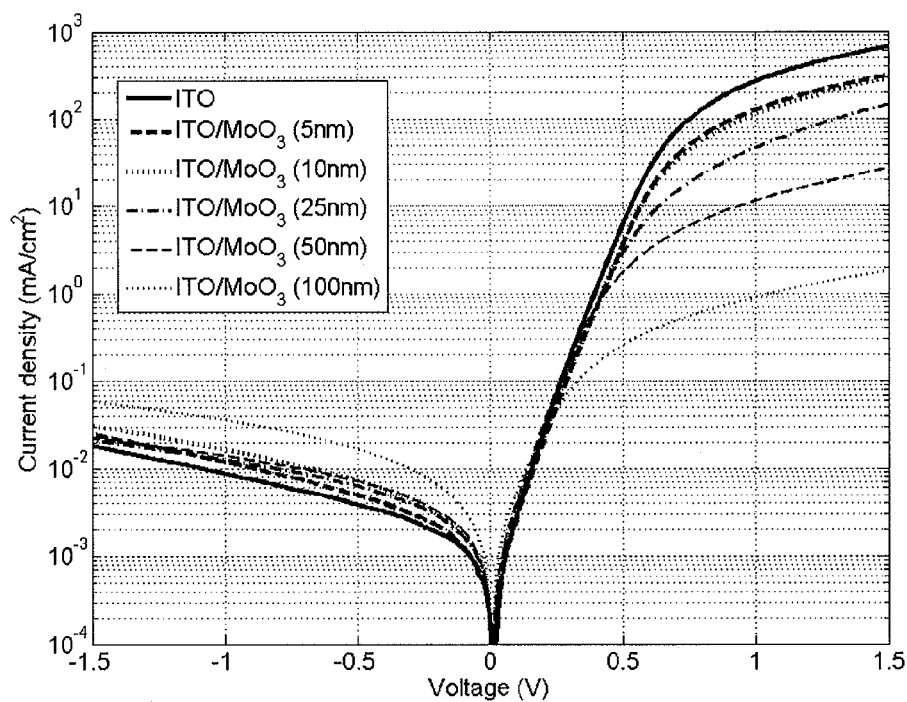
FIG. 4 shows the dark current-voltage characteristics corresponding to the current-voltage characteristics under illumination of FIG. 3.
Figure 5:
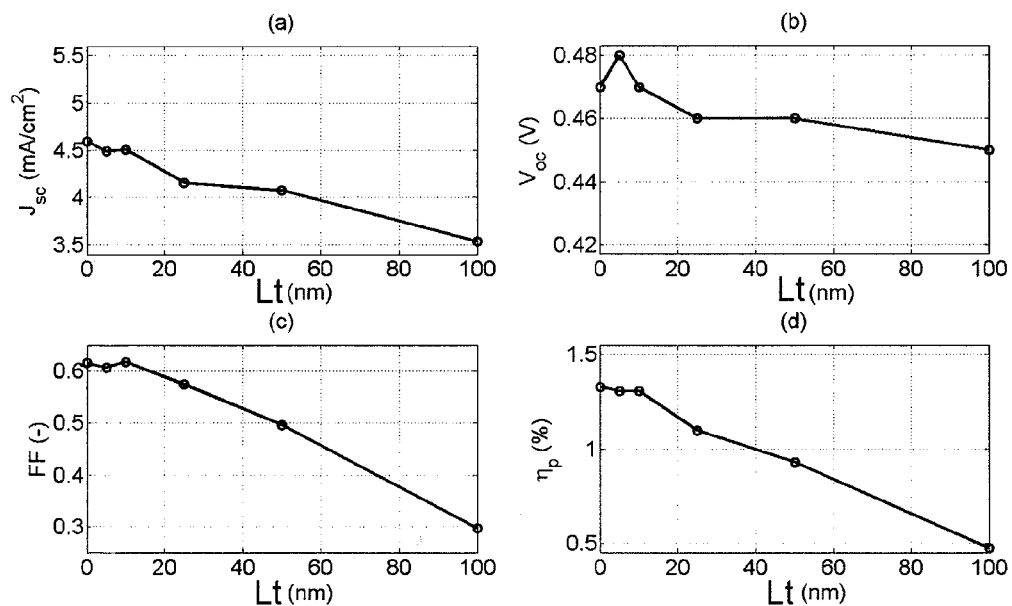
FIG. 5 shows the measured short-circuit current density, open-circuit voltage, Fill Factor and power conversion efficiency as a function of the thickness of an undoped metal oxide layer between the organic photovoltaic layer and an ITO contact layer.

FIGS. 3 and 4 show the current-voltage characteristics of the organic photovoltaic cells for different thicknesses of the (undoped) $MoO_3$ layer (0 nm, 5 nm, 10 nm, 25 nm, 50 nm and 100 nm). FIG. 3 shows the characteristics under illumination on a linear scale; FIG. 4 shows the dark characteristics on a logarithmic scale. The corresponding short-circuit current density $J_{sc}$, open-circuit voltage $V_{oc}$, Fill Factor FF and power conversion efficiency $\eta_p$ are shown in FIG. 5 as a function of the thickness (Lt) of the $MoO_3$ layer. From these results it can be concluded that increasing the thickness of the (undoped) $MoO_3$ layer leads to a significant reduction of the short-circuit current (reduction of 23% for a 100 nm thick $MoO_3$ layer as compared to a cell without such a layer) and a very strong reduction of the Fill Factor (reduction of more than 50% for a 100 nm thick $MoO_3$ layer as compared to a cell without such a layer). The reduction of the Fill Factor can be mainly attributed to an increase of the series resistance (Rtot) of the photovoltaic cell with increasing thickness of the $MoO_3$ layer. This strongly limits the usability of such a layer as an optical barrier layer or buffer layer. Therefore, there is a need for improving the electrical conductivity of such a layer.

The electrical conductivity of the $MoO_3$ layers was increased by doping the material with a metal, by means of thermal co-evaporation. Cells were fabricated on a glass substrate with an ITO layer, the cells comprising a 20 nm to 100 nm thick Al or Au-doped $MoO_3$ layer or a 5 nm to 110 nm Ag-doped $MoO_3$ layer on top of the ITO layer, followed by an organic photovoltaic layer comprising 30 nm of CuPc and 50 nm of $C_{60}$, with a 8 nm thick BCP layer (where the cell comprises a Al or Au-doped $MoO_3$ layer) or a 10 nm thick BCP layer (where the cell comprises a Ag-doped $MoO_3$ layer) and a 100 nm thick Al contact layer (where the cell comprises a Al or Au-doped $MoO_3$ layer) or a 100 nm thick Ag contact layer (where the cell comprises a Ag-doped $MoO_3$ layer) on top. As doping materials for the $MoO_3$ layer, Al and Au were used with a doping concentration of 2%.

Figure 6:
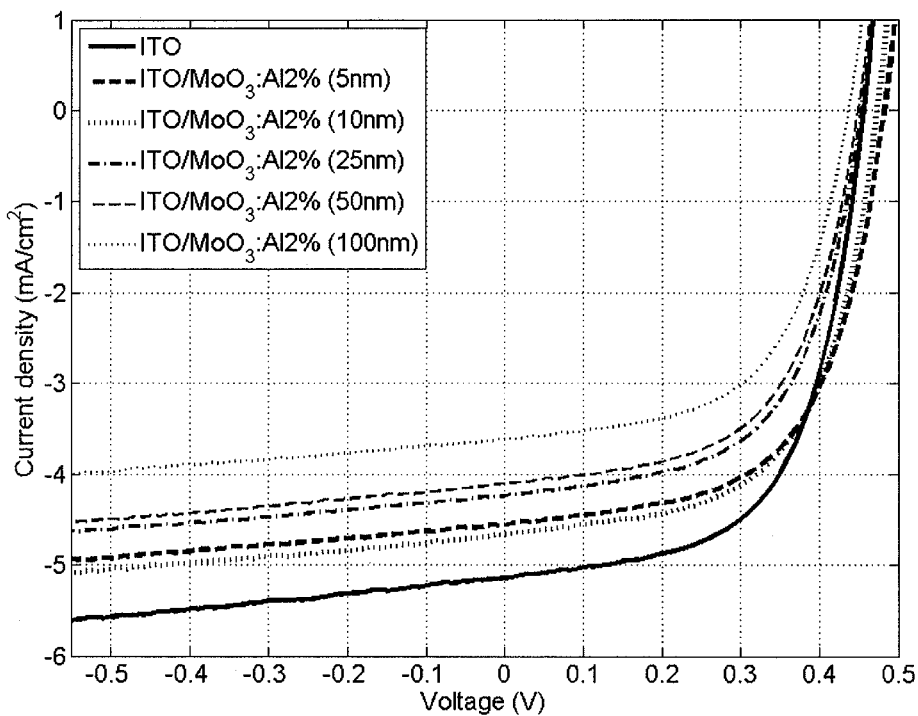
FIG. 6 shows the measured current-voltage characteristics under illumination for organic photovoltaic cells with an Al doped metal oxide buffer layer between the organic photovoltaic layer and an ITO contact layer (upper figure) and with an Au doped metal oxide buffer layer between the organic photovoltaic layer and an ITO contact layer (lower figure) according to a preferred embodiment.
Figure 6:
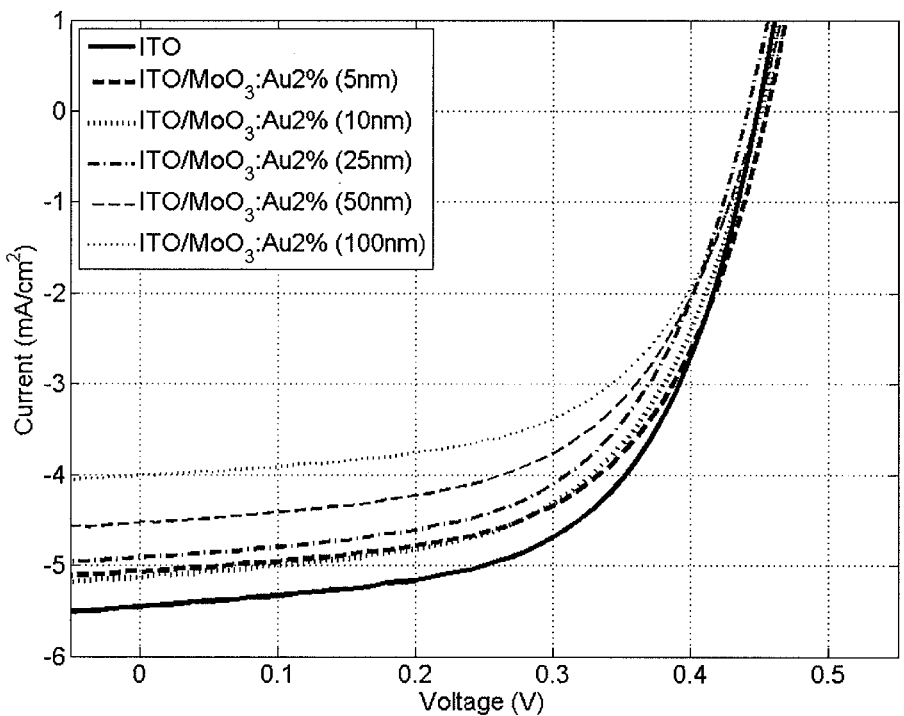
Figure 7:
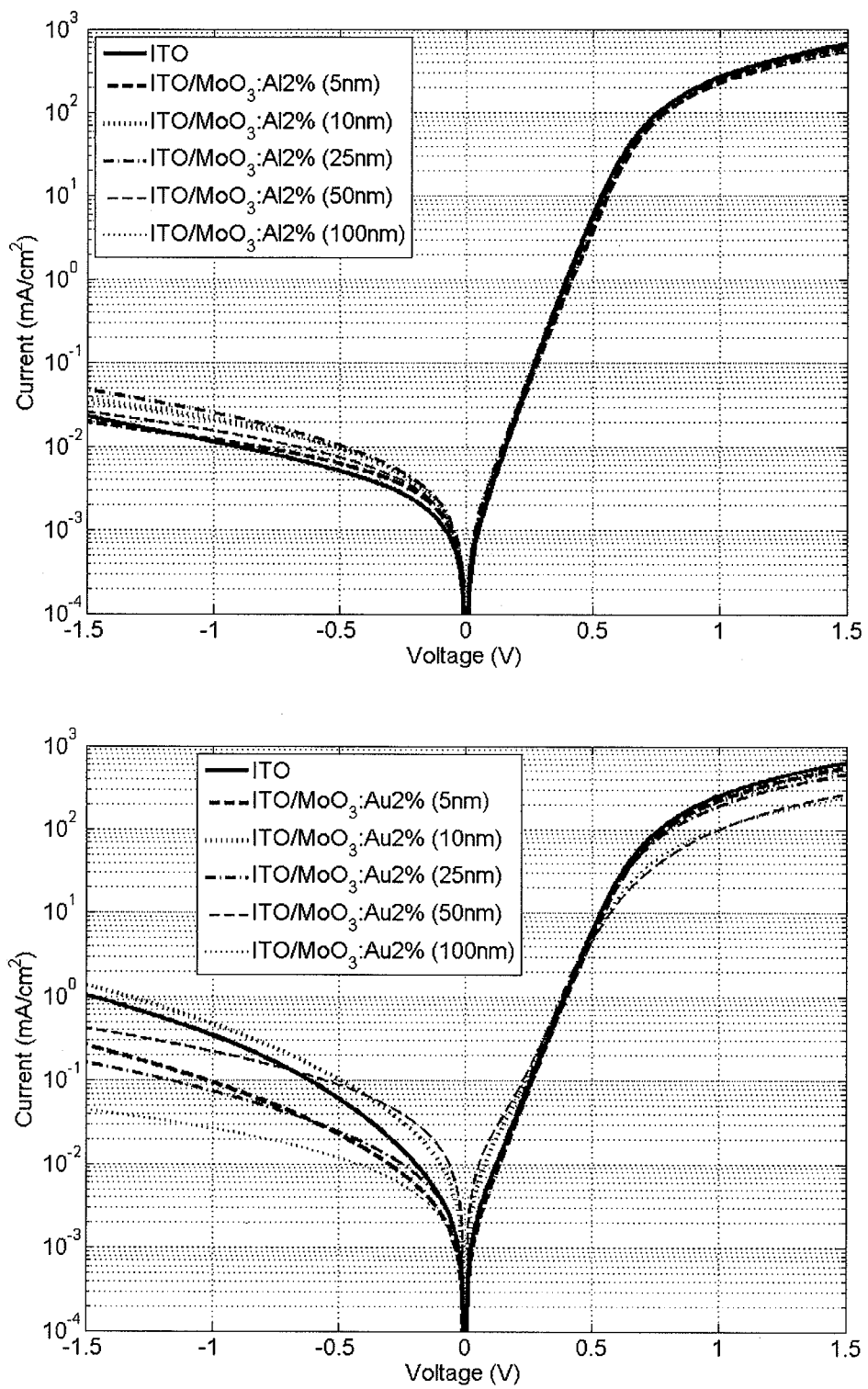
FIG. 7 shows the dark current-voltage characteristics for organic photovoltaic cells with an Al doped metal oxide buffer layer between the organic photovoltaic layer and an ITO contact layer (upper figure) and with an Au doped metal oxide buffer layer between the organic photovoltaic layer and an ITO contact layer (lower two figures) according to the same embodiment as for FIG. 6.
Figure 8:
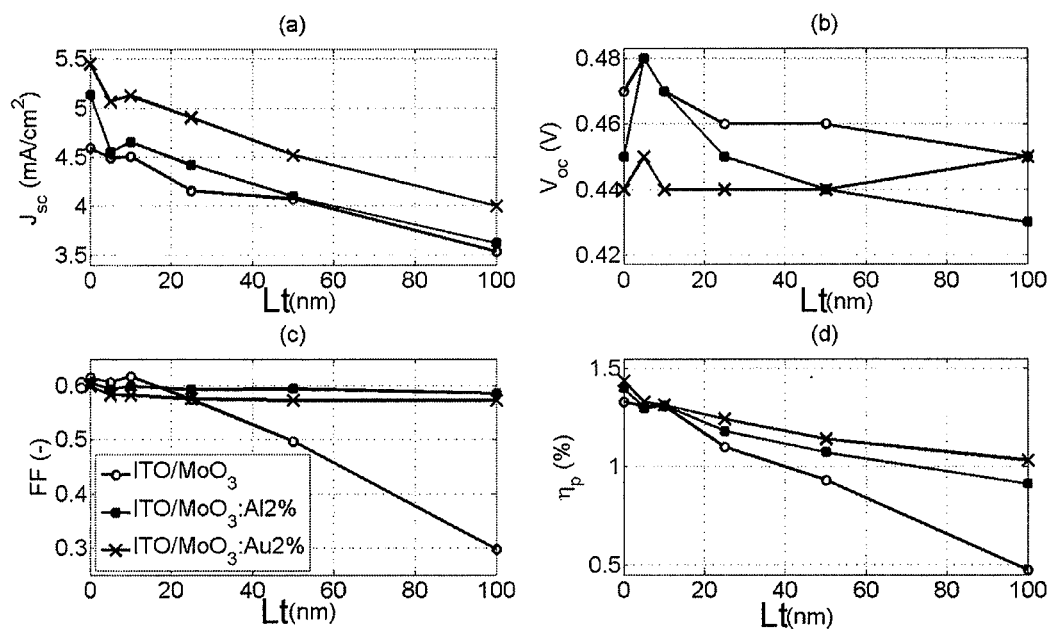
FIG. 8 shows the measured short-circuit current density, open-circuit voltage, Fill Factor and power conversion efficiency as a function of the thickness of a doped/undoped metal oxide layer between the organic photovoltaic layer and an ITO contact layer according to preferred embodiments.

FIGS. 6 and 7 show the current-voltage characteristics for the organic photovoltaic cells for different thicknesses of an Al- or Au-doped $MoO_3$ layer (0 nm, 5 nm, 10 nm, 25 nm, 50 nm and 100 nm). FIG. 6 (top) shows the characteristics under illumination on a linear scale for Al doped layers; FIG. 7 (top) shows the dark characteristics on a logarithmic scale for Al doped layers. FIG. 6 (bottom) shows the characteristics under illumination on a linear scale for Au doped layers; FIG. 7 (bottom) shows the dark characteristics on a logarithmic scale for Au doped layers. The corresponding short-circuit current density $J_{sc}$, open-circuit voltage $V_{oc}$, Fill Factor and power conversion efficiency are shown in FIG. 8 as a function of the thickness (Lt) of the $MoO_3$ layers. As a reference, also the characteristics of the cells with undoped $MoO_3$ layers are shown in FIG. 8.

It can be concluded that the conversion efficiency of the cells with doped $MoO_3$ layers of a given thickness is significantly better than the conversion efficiency of cells with undoped layers of the same thickness. Based on the dark current-voltage characteristics, it can be concluded that there is almost no influence of the thickness of the doped $MoO_3$ layer on the series resistance (Rtot) of the device. This indicates that doping the $MoO_3$ layer leads to an increased electrical conductivity of the layer. This is also reflected in the Fill Factor of the cells that is substantially independent of the doped $MoO_3$ layer thickness in the thickness range investigated. The short-circuit density is lower for the cells with a doped $MoO_3$ layer as compared to the cells with an undoped $MoO_3$ layer. This may be related to an increased absorption resulting from doping the metal oxide layer.

Figure 9:
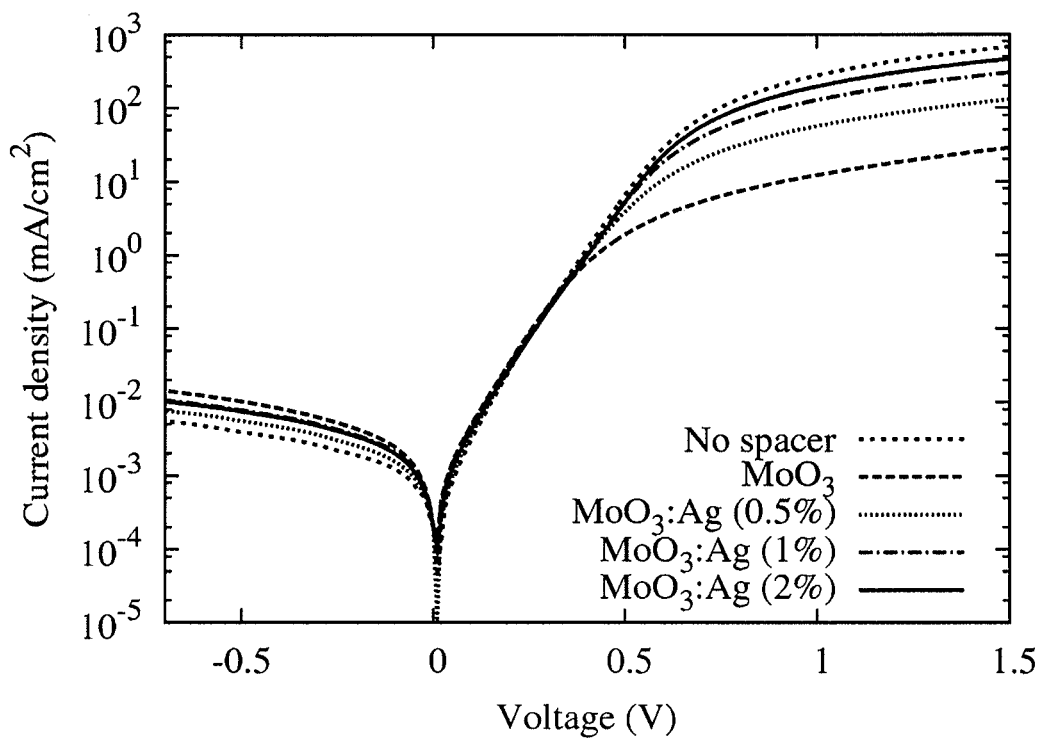
FIG. 9 shows the dark current-voltage characteristics (a) and the series resistance (b) extracted for organic photovoltaic cells for different doping level of an Ag-doped MoO$_3$ layer, as a function of the thickness of the MoO$_3$ layer according to preferred embodiments.
Figure 9:
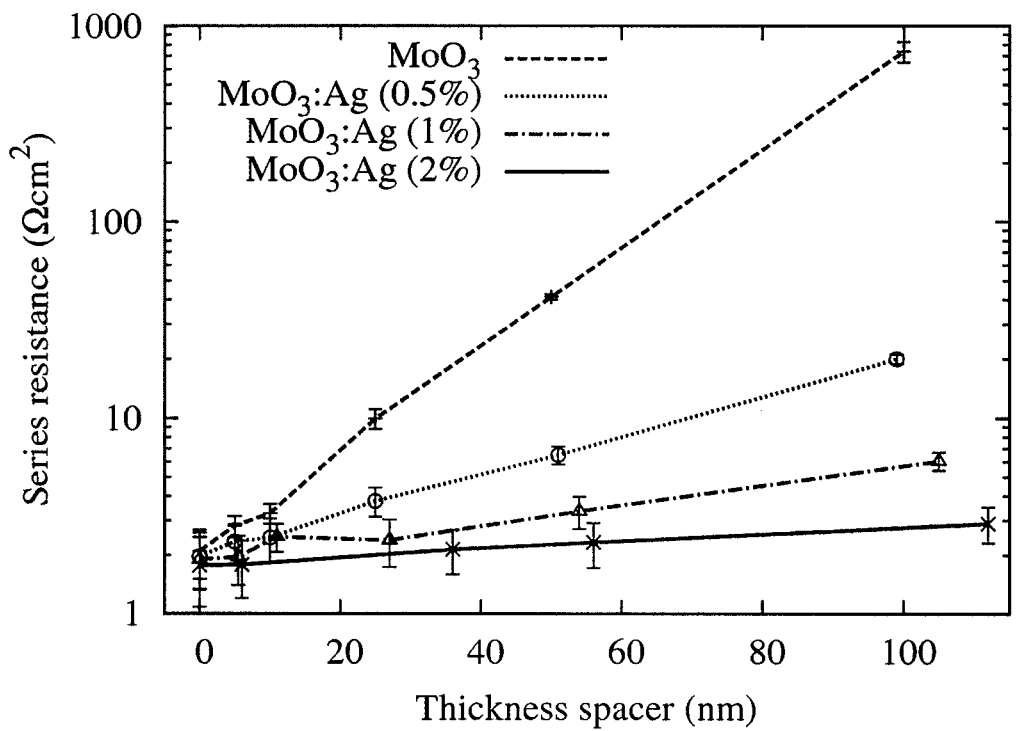

FIG. 9(a) shows the dark current-voltage characteristics on a logarithmic scale for the organic photovoltaic cells for different doping level of a Ag-doped $MoO_3$ layer (device without $MoO_3$ layer, undoped 100 nm thick $MoO_3$ layer, $MoO_3$ 100 nm thick layer doped at 0.5% with Ag, $MoO_3$ 100 nm thick layer doped at 1% with Ag, $MoO_3$ 100 nm thick layer doped at 2% with Ag).

FIG. 9(a) shows a reverse current that is independent of the layer composition, while the forward current increases with increasing doping concentration.

FIG. 9(b) shows series resistance (Rtot) extracted for the organic photovoltaic cells for different doping level of a Ag-doped $MoO_3$ layer (undoped 100 nm thick $MoO_3$ layer, $MoO_3$ 100 nm thick layer doped at 0.5% with Ag, $MoO_3$ 100 nm thick layer doped at 1% with Ag, $MoO_3$ 100 nm thick layer doped at 2% with Ag), as a function of the thickness of the $MoO_3$ layer. The various layers yield values for the series resistance that are dependent on both thickness and doping concentration. The variation in series resistance for small layer thickness is due to the resistivity through the ITO lines on the substrate. In all cases, the series resistance increases with increasing layer thickness. While this increase is drastic for the undoped MoO3 layers (3 orders of magnitude increase in series resistance for a 100 nm increase in thickness), the 2% doped layers have a very small series resistance dependence on the thickness. Even for 110 nm thick layers, the series resistance nearly matches the values of the control device as is also evident from FIG. 9(a). Decreasing the silver doping concentration increases the resistivity of the complete device. Similar effects have been observed when using Al, Au and Yb.

Figure 10:
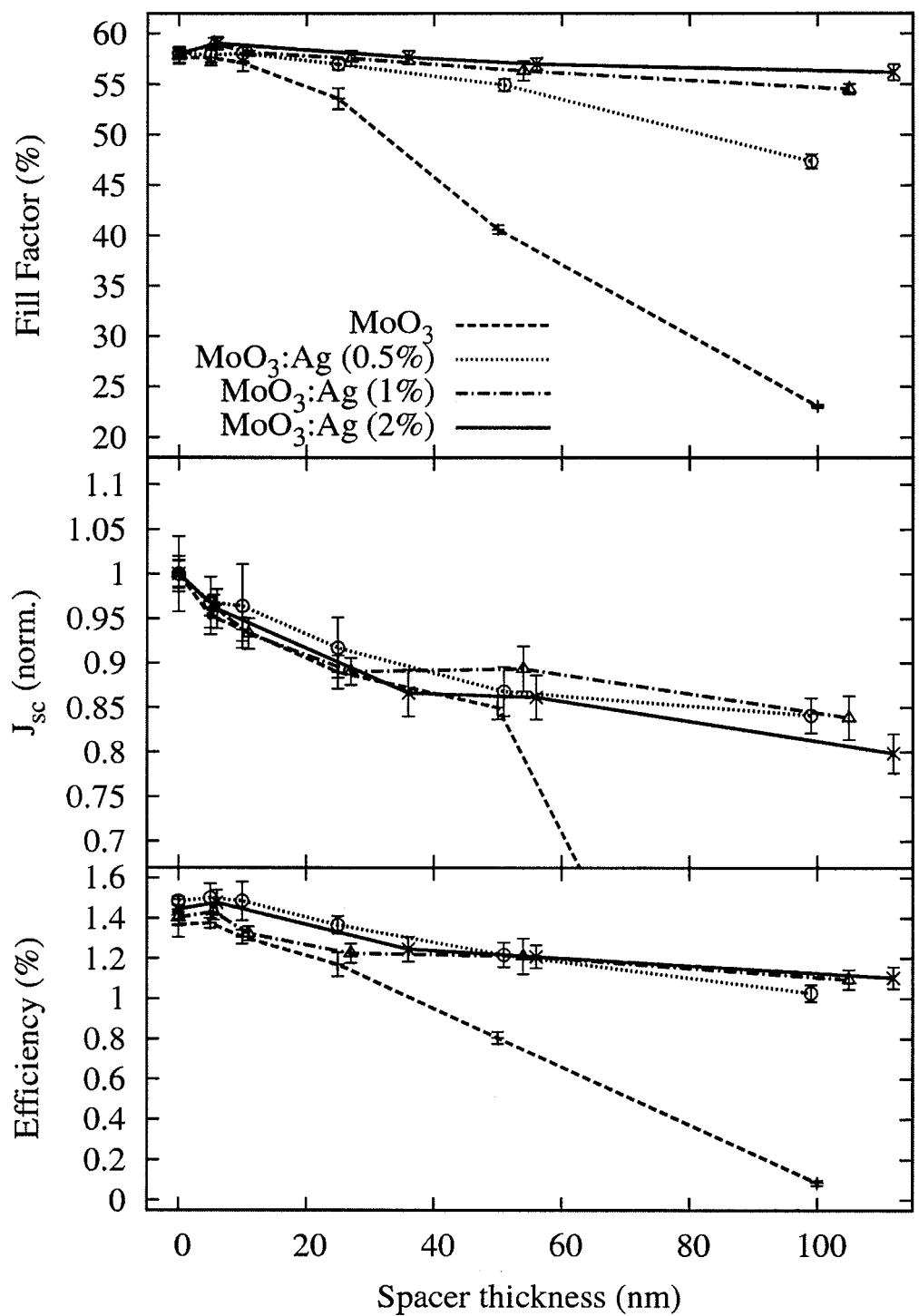
FIG. 10 shows extracted photovoltaic parameters for solar cells according to preferred embodiments.

Photovoltaic device parameters measured under illumination for the Ag doped devices are shown in FIG. 10. The open-circuit voltage ($V_{oc}$) is omitted as it was between 440 and 480 mV for all devices, with no clear dependence on thickness or layer composition. The fill-factor (FF) had the largest variations, with a decrease from an initial 60% to 23% for 100 nm thick undoped $MoO_3$ layers. However, doping improved FF drastically, and the FF as a function of thickness for 2% Ag doped layers stayed nearly the same as the control devices. It is known that FF is related to the conductivity of the individual layers and thus FF had the same thickness and doping concentration dependence as the series resistance. If a FF threshold of 55% would be defined, above which the resistive losses would be considered too high, corresponding to a limit for series resistance of about 6 $\Omega cm^2$, the maximum film thickness as defined by the FF threshold would be 20 nm for an undoped $MoO_3$ layer, while it is increased by doping to 50 nm for 0.5%, 100 nm for 1% and >110 nm for 2% Ag concentration. This indicates that small amounts of doping increase the conductivity of the metal oxide layer enough to allow for a thick film. Doping is also shown to improve efficiency (E) and current density (J).

In one embodiment, doped metal oxide layers can advantageously be used in tandem photovoltaic cells. For example, in organic photovoltaic tandem cells wherein different single junction cells are stacked on top of each other and electrically connected in series or in parallel, a doped metal oxide layer (or a stack of doped metal oxide layers) may be used as an interlayer between the single junction cells. Such an interlayer serves as an efficient charge recombination layer that prevents a build-up of charge inside the device. The layer is preferably sufficiently conductive and the thickness of the layer can be tuned to optimize the light intensity profile in the device such that the different single junction cells can absorb an optimized amount of light.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An organic optoelectronic device comprising a stack of layers, the stack of layers comprising:
    a buffer layer and a first organic semiconductor layer adjacent to the buffer layer at a first side of the buffer layer, wherein the buffer layer comprises at least one transition metal oxide doped with a metal dopant; and
    an electrical contact layer at a second side of the buffer layer opposite to the first side, the electrical contact layer being in direct physical contact with the buffer layer,
    wherein the buffer layer is optically transparent and the electrical contact layer is optically non-transparent and configured to reflect light incident thereupon.

2. The organic optoelectronic device according to claim 1, wherein the metal dopant is selected from the group consisting of transition elements, lanthanides, actinides, Al, Ga, In, Tl, Pb, Bi and Sn.

3. The organic optoelectronic device according to claim 1, wherein the transition metal oxide is a high work function metal oxide.

4. The organic optoelectronic device according to claim 1, wherein the electrical conductivity of the transition metal oxide doped with the metal dopant is higher than about $10^{-5}$ S/cm.

5. The organic optoelectronic device according to claim 1, wherein a thickness of the buffer layer is from about 2 nm to about 500 nm.

6. The organic optoelectronic device according to claim 1, wherein a thickness of the buffer layer is from about 20 nm to about 300 nm.

7. The organic optoelectronic device according to claim 1, wherein a thickness of the buffer layer is from about 30 nm to about 150 nm.

8. The organic optoelectronic device according to claim 1, wherein an optical transparency of the buffer layer is higher than about 80% in a wavelength range from about 300 nm to about 1200 nm.

9. The organic optoelectronic device according to claim 1, wherein a thickness of the buffer layer is selected for optimizing a light intensity profile in the device.

10. The organic optoelectronic device according to claim 1, wherein the device is selected from the group consisting of a photovoltaic cell, a photodetector, and a light emitting device.

11. A method for fabricating an organic optoelectronic device, the method comprising:
    providing a stack of layers, the stack comprising a buffer layer and a first organic semiconductor layer adjacent to the buffer layer at a first side of the buffer layer, wherein providing the buffer layer comprises providing at least one transition metal oxide layer doped with a metal dopant, whereby an organic optoelectronic device is obtained; and
    providing an electrical contact layer at a second side of the buffer layer opposite to the first side, the electrical contact layer being in direct physical contact with the buffer layer,
    wherein the buffer layer is optically transparent and the electrical contact layer is optically non-transparent and configured to reflect light incident thereupon.

12. The method according to claim 11, wherein the buffer layer is provided by thermal co-evaporation of a metal and a transition metal oxide.

13. The method according to claim 11, wherein the metal dopant is selected from the group consisting of transition elements, lanthanides, actinides, Al, Ga, In, Tl, Pb, Bi and Sn.

14. The method according to claim 11, wherein a thickness of the buffer layer is selected for optimizing a light intensity profile in the device.

15. The method according to claim 11, wherein the device is selected from the group consisting of a photovoltaic cell, a photodetector, and a light emitting device.

16. The method according to claim 11, wherein an electrical conductivity of the transition metal oxide layer doped with the metal dopant is higher than about $10^{-5}$ S/cm.

17. The method according to claim 11, wherein an optical transparency of the buffer layer is higher than about 80% in a wavelength range of from about 300 nm to about 1200 nm.

18. An organic optoelectronic device manufactured by the method according to claim 11.

* * * * *

UNITED STATES PATENT AND TRADEMARK OFFICE
CERTIFICATE OF CORRECTION

PATENT NO. : 8,592,804 B2  
APPLICATION NO. : 12/789202  
DATED : November 26, 2013  
INVENTOR(S) : Rand et al.

Page 1 of 1

It is certified that error appears in the above-identified patent and that said Letters Patent is hereby corrected as shown below:

In the Specification

Col. 5, line 48, please change "embodiment"means" to --embodiment" means--.

Col. 9, line 48, please delete "polyphenylenvinylene" to --polyphenylenevinylene--.

Signed and Sealed this
Twelfth Day of August, 2014

Michelle K. Lee
*Deputy Director of the United States Patent and Trademark Office*